(12) United States Patent
Klaba

(10) Patent No.: US 10,078,353 B2
(45) Date of Patent: Sep. 18, 2018

(54) CONTAINER FITTED IN A TECHNICAL INFRASTRUCTURE

(75) Inventor: Miroslaw Klaba, Roubaix (FR)

(73) Assignee: OVH, Roubaix (FR)

( * ) Notice: Subject to any disclaimer, the term of this patent is extended or adjusted under 35 U.S.C. 154(b) by 0 days.

(21) Appl. No.: 14/234,322

(22) PCT Filed: Aug. 27, 2012

(86) PCT No.: PCT/FR2012/051938
§ 371 (c)(1),
(2), (4) Date: Feb. 26, 2014

(87) PCT Pub. No.: WO2013/030501
PCT Pub. Date: Mar. 7, 2013

(65) Prior Publication Data
US 2014/0160672 A1    Jun. 12, 2014

(30) Foreign Application Priority Data

Sep. 1, 2011   (FR) ...................... 11 57760

(51) Int. Cl.
*G06F 1/20* (2006.01)
*G06F 1/16* (2006.01)
*H05K 7/14* (2006.01)
*H05K 7/20* (2006.01)

(52) U.S. Cl.
CPC .................. *G06F 1/20* (2013.01); *G06F 1/16* (2013.01); *H05K 7/1497* (2013.01); *H05K 7/20745* (2013.01)

(58) Field of Classification Search
CPC ........... G06F 1/16; G06F 1/20; H05K 7/1497; H05K 7/20745

USPC ....... 361/679.47–679.49, 692, 695; 454/184; 62/259.2; 181/198
See application file for complete search history.

(56) References Cited

U.S. PATENT DOCUMENTS

| | | | | |
|---|---|---|---|---|
| 5,370,178 A | * | 12/1994 | Agonafer | H01L 23/467 165/137 |
| 6,151,210 A | * | 11/2000 | Cercioglu | H05K 7/20572 165/104.33 |
| 6,225,705 B1 | | 5/2001 | Nakamats | |
| 7,154,748 B2 | * | 12/2006 | Yamada | H05K 7/20572 361/690 |
| 7,278,273 B1 | | 10/2007 | Whitted et al. | |

(Continued)

FOREIGN PATENT DOCUMENTS

| | | |
|---|---|---|
| EP | 2 354 378 A1 | 8/2011 |
| FR | 2895209 A1 | 6/2007 |

OTHER PUBLICATIONS

International Search Report for PCT/FR2012/051938 dated Aug. 10, 2012.

(Continued)

*Primary Examiner* — Dimary Lopez Cruz
*Assistant Examiner* — Zhengfu Feng
(74) *Attorney, Agent, or Firm* — BCF LLP

(57) ABSTRACT

A container fitted in a technical infrastructure including on a longitudinal side face, at least one opening arranged to allow the intake of air inside the container; on the opposite longitudinal side face, at least one fan arranged to expel the air from the inside to the outside of the container; and computer racks disposed in the middle of the container along its longitudinal axis.

15 Claims, 2 Drawing Sheets

(56) References Cited

U.S. PATENT DOCUMENTS

| | | | |
|---|---|---|---|
| 7,365,977 B2* | 4/2008 | Fujiya | H05K 7/20736 361/690 |
| 7,430,118 B1 | 9/2008 | Noteboom et al. | |
| 7,508,663 B2 | 3/2009 | Coglitore | |
| 7,658,039 B2 | 2/2010 | Ziegelman | |
| 7,733,648 B2* | 6/2010 | Fujiya | H05K 7/20736 361/679.48 |
| 7,961,463 B2 | 6/2011 | Belady et al. | |
| 8,151,537 B2 | 4/2012 | Pope | |
| 8,844,220 B2 | 9/2014 | Boersema | |
| 8,931,227 B2 | 1/2015 | Keane | |
| 2005/0168945 A1 | 8/2005 | Coglitore | |
| 2006/0185515 A1* | 8/2006 | Hirano | H05K 5/0213 96/108 |
| 2006/0187636 A1 | 8/2006 | Fink et al. | |
| 2007/0064391 A1* | 3/2007 | Lewis, II | H05K 7/20736 361/695 |
| 2008/0239668 A1* | 10/2008 | Hendrix | H05K 7/20563 361/695 |
| 2008/0257639 A1* | 10/2008 | Yamaguchi | H05K 7/20736 181/198 |
| 2009/0046427 A1* | 2/2009 | Noteboom | H05K 7/20745 361/695 |
| 2009/0229194 A1 | 9/2009 | Armillas | |
| 2009/0251860 A1* | 10/2009 | Belady | H05K 7/20745 361/690 |
| 2010/0027216 A1* | 2/2010 | Matsushima | H05K 7/20745 361/679.49 |
| 2010/0110626 A1 | 5/2010 | Schmitt et al. | |
| 2010/0251629 A1 | 10/2010 | Clidaras et al. | |
| 2011/0138708 A1* | 6/2011 | Chazelle | E04H 1/06 52/173.1 |
| 2012/0162906 A1* | 6/2012 | Jai | H05K 7/20745 361/679.53 |
| 2014/0141707 A1 | 5/2014 | Carlson et al. | |
| 2014/0259966 A1 | 9/2014 | Totani et al. | |

OTHER PUBLICATIONS

International Search Report of PCT/FR2012/051913, dated Dec. 18, 2012.
English Abstract for FR2895209 retrieved on Espacenet on Mar. 16, 2018.
European Search Report with regard to the counterpart application EP 17194131 dated Feb. 14, 2018.

* cited by examiner

SECTION A-A

CONTAINER FITTED IN A TECHNICAL INFRASTRUCTURE

CROSS REFERENCE TO RELATED APPLICATIONS

This application is a National Stage of International Application No. PCT/FR2012/051938, filed on Aug. 27, 2012, which claims priority from French Patent Application No. 1157760, filed Sep. 1, 2011, the contents of all of which are incorporated herein by reference in their entirety.

The present invention concerns technical infrastructures, and more particularly the fitting out of said infrastructures.

As used herein, "technical infrastructure" designates any capital infrastructure dedicated to information and communication technologies such as a computing center/data center, hosting center, backup site, or telecom/carrier hotel, or server farm. These infrastructures generally take the form of computer rooms (or buildings) comprising, by way of non-limiting examples, telecommunications equipment, servers, storage systems, power supply systems, cooling systems, inverters, electrical distribution systems, and workstations.

Moreover, "fitting out" of a technical infrastructure is understood as its conditioning to meet all of the requirements during its lifecycle (i.e., design, deployment, operation, maintenance). Among these requirements are:
  energy efficiency and respect for the environment: to push the PUE (Power Usage Effectiveness) of a technical infrastructure to the most optimized ratios for economic as well as environmental reasons;
  speed of deployment: to be able to respond quickly to urgent and temporary demands by optimizing the time required to place a technical infrastructure in service;
  portability/mobility: to be able to transport a technical infrastructure to or from any place in the event of natural, political or social hazards (such as riots, earthquakes, snowstorms, hurricanes, floods, fires);
  modularity: to be able to restructure/expand a technical infrastructure at any time.

These requirements have given rise to the emergence of new designs for technical infrastructures, and particularly for data centers.

Of particular note in this domain is the containerization of data centers (i.e., placing them in a container). "Container" is understood herein as a conventional metal enclosure, parallelepiped in shape, for transporting merchandise. Indeed, computer rooms fitted in containers equipped with cooling systems are already available.

More generally, metal containers (designated as modules in the prior art) that are specially designed to house computer rooms and equipped with cooling systems have already been proposed.

However, the existing solutions are imperfect, particularly because they are not optimal. These containers/modules have limits, particularly in terms of energy efficiency and respect for the environment.

Indeed, with computer equipment that requires more and more energy and a constantly increasing power density due to cooling systems pushed to the limits of their capacities,
  setting up a computer room in a container for transportability without taking into consideration its PUE; or
  fitting out a container in the same way as a conventional computer room risks compromising the overall cost (PUE) of data centers, as well as impacting the environment.

An object of the present invention is to remedy the aforementioned disadvantages.

Another object of the present invention is to improve the energy efficiency of a data center set up in a container.

An object of the present invention is to optimize the fitting out of a container in order to design data centers that are more energy-efficient.

Another object of the present invention is to improve the ecological footprint of a data center.

Another object of the present invention is to take environmental parameters into account in the fitting out of technical infrastructures.

Another object of the present invention is to avoid using a heavy electrical infrastructure for the cooling of a technical infrastructure.

Another object of the present invention, given the energy constraints, is to rethink the arrangement of computer rooms set up in containers.

Another object of the present invention is to propose architectures of technical infrastructures that integrate sustainable resources.

Another object of the present invention is to integrate the environmental dimension in the design of data centers.

To that end, the invention relates, according to a first aspect, to a container fitted out as a technical infrastructure comprising
  on one longitudinal lateral face, at least one opening made to allow the entry of air into the container;
  on the opposite longitudinal lateral face, at least one ventilator arranged to move the air from the interior to the exterior of the container;
  computer bays in the middle of the container along its longitudinal axis.

According to a second aspect, the invention proposes a data center comprising a plurality of containers fitted out as a technical infrastructure as defined above, said fitted-out containers being arranged in the form of a chimney, the cavity of which is open upwards.

Other characteristics and advantages of the invention will be seen more clearly and specifically from the following description of preferred embodiments, with reference to the appended drawings in which.

Figure 1:
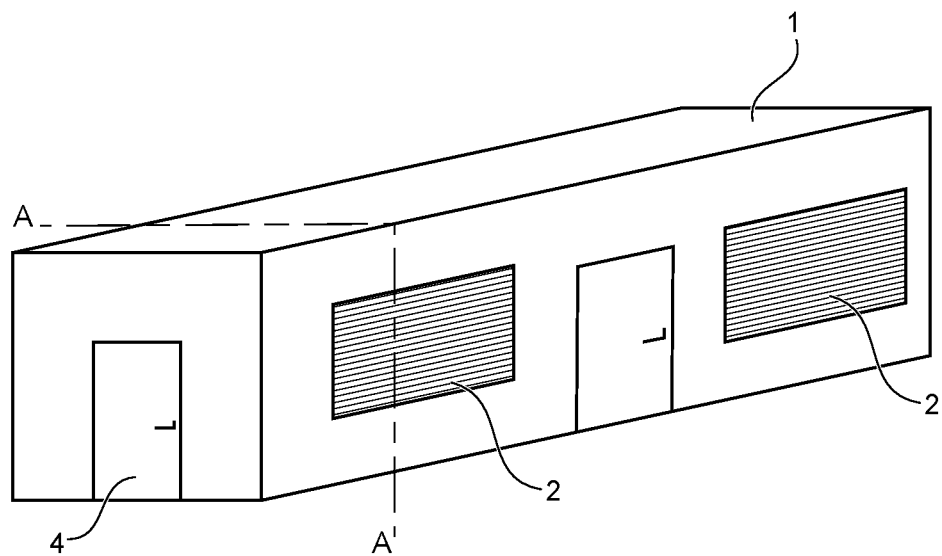
FIGS. 1 and 2 illustrate schematically a profile view and a cross-sectional side view, respectively, of a container fitted out according to one embodiment.
Figure 2:
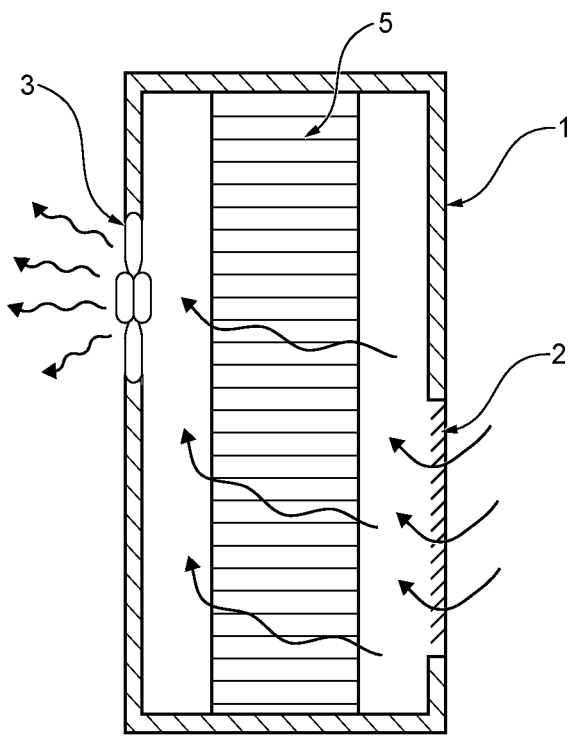

With reference to FIGS. 1 and 2, transformations are made to the container 1 to comprise:
  on one longitudinal lateral face, a plurality of quadrangular openings 2 (particularly in the form of ventilation louvers) arranged to allow the entry of air into the container 1;
  on the opposite longitudinal lateral face, a plurality of ventilators 3 arranged to move the air from the interior to the exterior of the container 1; and
  at least one door 4.

As illustrated in the profile view of the container 1 in FIG. 2, the computer bays 5 (or, computer racks) are arranged in the middle of the container along its longitudinal axis in such a way as to form two open longitudinal aisles. Consequently, there is one aisle on each side of the computer bays 5 allowing unhindered access to the computer equipment. In particular, there is no restriction on the type of bays 5, which can be of any origin.

As can be seen in FIG. 2, the ventilators 3 and the openings 2 are preferably vertically offset at two different heights of the two opposite longitudinal lateral faces. The ventilators 3 are higher in order to move the hot air, and the openings 2 are lower in order to better cool the bays with the incoming air assumed to be at a temperature lower than that of the interior of the container.

Moreover, FIG. 2 illustrates the airflow from the air intake of the fitted-out container 1, i.e., from right to left in FIG. 2. Indeed, we see
- the intake of the ambient air from the force of the wind or by the low pressure generated by the ventilators 3;
- the flow of the air through the computer equipment of the racks 5;
- the evacuation to the exterior of the container 1 of the hot air by the ventilators 3.

Advantageously, the two aisles on either side of the computer bays 5 favor, respectively,
- the uniform inflow of the airflows perpendicular to the direction of arrangement of the computer bays 5, which represents an exposure that is favorable for the cooling of the computer equipment;
- the exhaust of the hot air via the ventilators 3 that are operational in line with and in the direction of the hot airflows.

The result is that the low pressure generated by the ventilators 3 at the intake of the openings 2 (i.e., the ventilation louvers), the two open aisles on either side of the computer racks 5, and the ventilators 3 on the opposite face, provide natural ventilation of the computer room set up in the container 1.

Advantageously, this inter-arrangement of the openings 2, ventilators 3 and computer bays 5 promotes the optimal cooling by the ambient air of the computer room set up in the container 1.

Indeed, said inter-arrangement of the openings 2, ventilators 3 and computer bays 5 has the technical effect of better ventilation of the racks arranged perpendicular to the direction of propagation of the incoming airflow. The arrangement of the ventilators 3 on the face opposite that of the openings 2 favors the creation of an air current, allowing the natural ventilation of the computer bays 5.

Therefore, by contributing to the improvement of energy efficiency of the data center, the inter-arrangement of these elements (openings, ventilators, computer bays) is particularly functional.

Consequently, the data center set up in the container 1 is completely cooled by exterior ambient air.

Preferably, filters—installed next to the openings 2—filter dust and harmful gases from the incoming air, and regulate the humidity level. Said filters are particularly useful when the container 1 is installed in areas that are too humid or where there is a heavy circulation of dust or harmful gases (for example coastal zone, construction site, industrial zone). These filters are configured in particular to maintain the humidity level of the incoming air within a predefined interval, or if necessary, to trigger a control device to maintain the humidity level within said interval.

Preferably, the openings 3 are controlled by a system for automatically regulating the degrees of opening (ventilation louvers for example), and consequently, the flow rate of incoming air, depending on the required cooling load.

It should be noted that the number and dimensions of the openings 2, as well as those of the ventilators 3, are selected so as to take into account a plurality of factors, including the environment of deployment and the computer load of the technical infrastructure.

It should also be noted that additional cooling systems can be combined with the cooling system by outdoor air as described above. For example, cooling systems by gas/liquid expansion, cold water, or water can be adopted in combination, as an option or as a fallback solution to the cooling system by outdoor air.

In combination with a liquid cooling system (water for example), two cooling systems can coexist for the data center (or hosting center) set up in the container 1.

The fitted-out container 1 further comprises means provided for safety, fire safety, and risk management (sensors, systems for detecting water leaks and smoke for example).

In one embodiment, the fitted-out container 1 is arranged in such a way that its interior can communicate with the interior of at least one other fitted-out container 1, and is therefore expandable.

Figure 3:
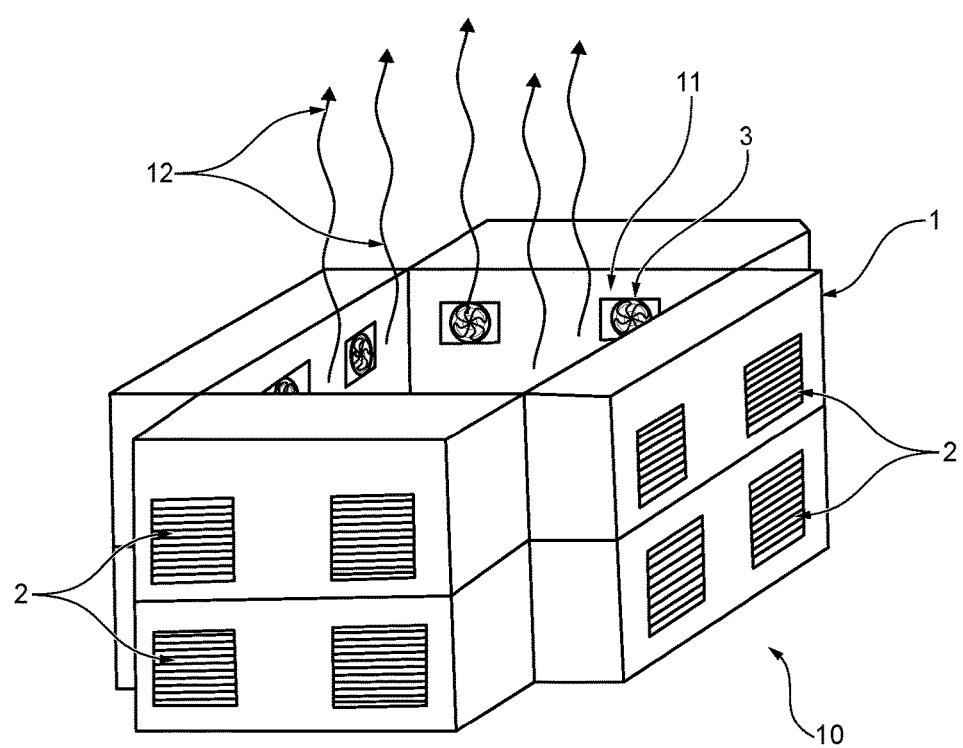
FIG. 3 illustrates schematically an architecture of a data center obtained by arranging containers fitted out according to one embodiment.

In one embodiment illustrated in FIG. 3, a plurality of fitted-out containers 1 are organized to form a chimney. The resulting technical infrastructure 10 thus constitutes a building that is hollow [in the center] having a cavity 11 open upwards.

The ventilators 3, facing the cavity 11 of the data center 1, make it possible to send the hot air into the cavity 11, which in turn, by the chimney effect, evacuates it towards the exterior. The chimney effect is due to the temperature difference between the hot air inside the data center (resulting technical infrastructure) 10 and the cold air from the outside, which causes an ascending movement 12 of air from the ventilators 3.

Advantageously, the combination of the chimney effect produced by the cavity 11 and the force of the wind at the entrance of the openings 2, made in the lateral faces of the fitted-out containers 2, ensure natural ventilation of the data center 10. In other words, the air is naturally caused to move through the fitted-out containers 1 of the technical infrastructure 10. Indeed, the air blown through the wall openings 2 to the interior of the technical infrastructure 10 results in thermal draft to the cavity 11 via the ventilators 3.

Preferably, the cavity 11 is a convex polygon, particularly rectangular or square. As a variant, the cavity 11 is a concave or crossed polygon.

The system just described has a number of advantages, including:
- a high-performance, economical technical infrastructure can be made available quickly;
- if the ambient temperature at the deployment location is lower than a predefined value, the system provides a considerable improvement in energy efficiency of the technical infrastructures;
- reduced cost of installation and operation compared to that of traditional data centers;
- the construction of ecological computer buildings.

It should be noted that the term "container" as used here includes any metal enclosure similar to a conventional container without necessarily being of the standardized dimensions of a freight container.

The preceding description is made with reference to a computer room or data center, but obviously, this example of technical infrastructure is not limiting and can refer to any other capital infrastructure dedicated to information and communication technologies.

The invention claimed is:

1. A container fitted out as a technical infrastructure comprising:
   on a first longitudinal lateral face, at least one opening that allows entry of air into an interior of the container;
   on a second longitudinal lateral face opposite the first longitudinal lateral face, at least one ventilator that moves the air from the interior to an exterior of the container;

computer bays disposed in an arrangement in a middle of the interior of the container along a longitudinal, horizontal axis of the container, the at least one opening and the at least one ventilator are arranged to cause the air to flow through the container generally perpendicularly to the longitudinal, horizontal axis along which the computer bays are arranged;

at least one filter that filters the air entering the interior and that regulates a level of humidity of the air entering the interior; and a transverse lateral face arranged to allow the interior of the container to communicate with an interior of at least a second fitted out container, the container and the second fitted out container forming a third, expanded container along the longitudinal, horizontal axis.

2. The container according to claim 1, wherein the at least one opening and the at least one ventilator are vertically offset at two different heights, respectively, on the first longitudinal lateral face and the second longitudinal lateral face.

3. The container according to claim 1, further comprising a cooling system by water.

4. A data center comprising a plurality of containers fitted out as a technical infrastructure as defined in claim 1.

5. The data center according to claim 4, characterized in that the fitted-out containers are arranged in the form of a chimney, a cavity of which is open upwards.

6. The container according to claim 1, wherein the at least one opening that allows entry of air into the interior of the container and the at least one ventilator that moves the air from the interior of the container to the exterior of the container are both located on a same floor of the container.

7. The container according to claim 1, wherein the ventilator comprises a fan.

8. A container fitted out as a technical infrastructure, the container having a rectangular parallelepiped geometry extending along a longitudinal, horizontal axis and with an interior and an exterior; the container comprising:

on a first longitudinal lateral wall, an opening for entry of air into the interior of the container;

on a second longitudinal lateral wall opposite the first longitudinal lateral wall, a ventilator that moves the air from the interior to the exterior;

computer bays arranged in the interior along the longitudinal, horizontal axis of the container and separated by spaces from the first longitudinal lateral wall and from the second longitudinal lateral wall to allow a human body to completely enter the spaces to access the computer bays, the opening and the ventilator conduct the air to flow through the container across the computer bays in a direction generally perpendicular to the longitudinal, horizontal axis along which the computer bays are arranged;

a filter that filters the air entering the interior and that regulates a level of humidity of the air entering the interior; and a transverse lateral face arranged to allow the interior of the container to communicate with an interior of at least a second fitted out container, the container and the second fitted out container forming a third, expanded container along the longitudinal, horizontal axis.

9. The container according to claim 8, wherein the opening and the ventilator are vertically offset at two different heights on the two opposite longitudinal lateral faces, with the opening at a height lower than the ventilator.

10. A data center comprising a plurality of containers, each container according to claim 8, the plurality of containers organized as an enclosed cavity that extends vertically and that is open upwards to thereby form a building in the form of a chimney, wherein the chimney is delimited by the container walls.

11. The data center according to claim 10, wherein for each container, the ventilator faces the enclosed cavity.

12. A data center comprising a plurality of containers, each container according to claim 8, wherein each container is modular and connected to at least one other of the plurality of containers so that the interiors of the connected containers are in communication with each other.

13. The container according to claim 8, comprising a door to allow the human body to completely enter the spaces to access the computer bays, the door located in a wall other than the first longitudinal lateral wall and the second longitudinal lateral wall.

14. The container according to claim 8, comprising an aisle for human access on each side of the computer bays allowing access to the computer bays.

15. The container according to claim 8, wherein the ventilator comprises a fan.

* * * * *